(12) United States Patent
Koudar et al.

(10) Patent No.: US 10,585,178 B2
(45) Date of Patent: Mar. 10, 2020

(54) PIEZO TRANSDUCER CONTROLLER AND METHOD HAVING ADAPTIVELY-TUNED LINEAR DAMPING

(71) Applicant: SEMICONDUCTOR COMPONENTS INDUSTRIES, LLC, Phoenix, AZ (US)

(72) Inventors: Ivan Koudar, Modrice (CZ); Jan Ledvina, Tovacov (CZ); Jiri Kutej, Brno (CZ); Pavel Horsky, Brno (CZ)

(73) Assignee: SEMICONDUCTOR COMPONENENTS INDUSTRIES, LLC, Phoenix, AZ (US)

( * ) Notice: Subject to any disclaimer, the term of this patent is extended or adjusted under 35 U.S.C. 154(b) by 553 days.

(21) Appl. No.: 15/207,756

(22) Filed: Jul. 12, 2016

(65) Prior Publication Data

US 2017/0115382 A1    Apr. 27, 2017

Related U.S. Application Data

(60) Provisional application No. 62/244,394, filed on Oct. 21, 2015.

(51) Int. Cl.
*G01S 1/72* (2006.01)
*G01S 7/524* (2006.01)
(Continued)

(52) U.S. Cl.
CPC .......... *G01S 7/524* (2013.01); *G01S 7/52004* (2013.01); *G01S 15/10* (2013.01); *G01S 15/931* (2013.01);
(Continued)

(58) Field of Classification Search
None
See application file for complete search history.

(56) References Cited

U.S. PATENT DOCUMENTS 2,706,285 A * 4/1955 Scott .................. G01S 7/52004
367/13
2,842,959 A * 7/1958 Henry .................. B06B 1/0215
310/317

(Continued)

FOREIGN PATENT DOCUMENTS

DE 19836483 A1 2/2000
EP 2881181 A1 6/2015

OTHER PUBLICATIONS

Electromagnetic and Piezoelectric Transducers. Andr'e Preumont and Bilal Mokrani. ULB, Active Structures Laboratory, CP. 165-42, 50 Av. F.D. Roosevelt, B-1050 Brussels, Belgium. 2013. (Year: 2013).*

(Continued)

*Primary Examiner* — Hovhannes Baghdasaryan
*Assistant Examiner* — Jonathan D Armstrong
(74) *Attorney, Agent, or Firm* — Ramey & Schwaller, LLP

(57) ABSTRACT

An illustrative controller embodiment includes: a transmitter that causes reverberation of a piezoelectric transducer; and a linear damping module that measures characteristics of the reverberation and tunes at least one of a shunt resistance and a shunt reactance for the piezoelectric transducer based on said characteristics. An illustrative sensor embodiment includes: a piezoelectric transducer; and a transducer controller coupled to the piezoelectric transducer to transmit pulses and receive echoes for measuring distances. The controller includes a linear damping module with: a shunt resistance; a shunt inductance; and an optional switch that couples the shunt resistance and shunt inductance in parallel to the piezoelectric transducer to damp reverberation of the piezoelectric transducer after said transmit pulses. The controller measures at least one characteristic of said reverbera- (Continued)

tion and responsively tunes the shunt resistance or the shunt inductance.

20 Claims, 5 Drawing Sheets

(51) Int. Cl.
G01S 7/52 (2006.01)
G01S 15/10 (2006.01)
G01S 15/931 (2020.01)
H01L 41/04 (2006.01)

(52) U.S. Cl.
CPC .. H01L 41/042 (2013.01); G01S 2007/52007 (2013.01); G01S 2015/932 (2013.01); G01S 2015/938 (2013.01)

(56) References Cited

U.S. PATENT DOCUMENTS

| | | | | | |
|---|---|---|---|---|---|
| 3,296,511 | A | * | 1/1967 | Josephus | B06B 1/0253 310/316.01 |
| 4,122,725 | A | * | 10/1978 | Thompson | B06B 1/0622 188/268 |
| 4,158,787 | A | * | 6/1979 | Forward | G10K 11/178 310/51 |
| 4,679,160 | A | * | 7/1987 | Whitener | G01W 1/14 340/621 |
| 4,750,117 | A | * | 6/1988 | Gregory | G01W 1/14 340/621 |
| 4,954,960 | A | * | 9/1990 | Lo | B06B 1/0253 318/729 |
| 4,965,532 | A | * | 10/1990 | Sakurai | G01N 29/36 310/316.01 |
| 4,970,656 | A | * | 11/1990 | Lo | B06B 1/0253 310/316.01 |
| 5,001,649 | A | * | 3/1991 | Lo | A61F 9/00745 310/316.01 |
| 5,032,753 | A | * | 7/1991 | Yamaguchi | H02N 2/001 310/317 |
| 5,185,585 | A | * | 2/1993 | Newell | H03B 5/38 331/105 |
| 5,309,410 | A | * | 5/1994 | Kittower | B06B 1/0269 367/131 |
| 5,631,876 | A | * | 5/1997 | Donegan | G01S 7/527 367/135 |
| 5,910,756 | A | * | 6/1999 | Ella | H03H 9/0095 310/322 |
| 6,060,813 | A | * | 5/2000 | Nowak | H04N 1/00519 310/314 |
| 6,422,685 | B1 | * | 7/2002 | Kondo | B41J 2/04541 347/46 |
| 6,426,680 | B1 | * | 7/2002 | Duncan | H01F 17/0006 257/E27.046 |
| 6,516,667 | B1 | * | 2/2003 | Broad | G01S 7/52025 600/443 |
| 6,731,569 | B2 | | 5/2004 | Yurchenko et al. | |
| 2002/0050861 | A1 | * | 5/2002 | Nguyen | H03F 1/3211 330/254 |
| 2003/0036704 | A1 | * | 2/2003 | Cerofolini | G01S 7/5208 600/437 |
| 2005/0188743 | A1 | * | 9/2005 | Land | G01N 29/12 73/1.82 |
| 2007/0115073 | A1 | * | 5/2007 | Rohde | H03B 5/1847 331/185 |
| 2009/0038932 | A1 | * | 2/2009 | Denslow | B01F 5/10 204/157.15 |
| 2009/0066192 | A1 | * | 3/2009 | Taki | A61B 17/320068 310/354 |
| 2013/0100575 | A1 | * | 4/2013 | O'Brien | H02N 2/181 361/283.1 |
| 2015/0226556 | A1 | * | 8/2015 | Aaltonen | G01C 19/5712 73/504.12 |
| 2016/0334534 | A1 | * | 11/2016 | Mandviwala | G01V 3/28 |
| 2016/0380640 | A1 | * | 12/2016 | Boser | H03K 3/0231 367/13 |
| 2017/0074977 | A1 | * | 3/2017 | Koudar | G01S 7/52004 |
| 2017/0115382 | A1 | * | 4/2017 | Koudar | G01S 7/524 |
| 2018/0062062 | A1 | * | 3/2018 | de Bonfim Gripp | H01L 41/042 |
| 2018/0131478 | A1 | * | 5/2018 | Song | H04B 7/04 |
| 2018/0364341 | A1 | * | 12/2018 | Ding | G01S 7/524 |

OTHER PUBLICATIONS

Kuang, Y., et al. "Resonance tracking and vibration stablilization for high power ultrasonic transducers." Ultrasonics 54.1 (2014): 187-194. (Year: 2014).*

Beck, Benjamin Stewart. Negative capacitance shunting of piezoelectric patches for vibration control of continuous systems. Diss. Georgia Institute of Technology, 2012. (Year: 2012).*

* cited by examiner

PIEZO TRANSDUCER CONTROLLER AND METHOD HAVING ADAPTIVELY-TUNED LINEAR DAMPING

REFERENCE TO RELATED APPLICATIONS

The present application claims priority to Provisional U.S. Application 62/244,394, filed 2015 Oct. 21 and titled "Method of forming a transducer controller and circuit therefor" by inventors I. Koudar, J. Ledvina, J. Kutej, and P. Horsky.

BACKGROUND

Accurate, yet inexpensive, distance measurements can be provided by an ultrasonic radar system that combines a piezoelectric transducer with a transducer controller. The controller may employ the piezoelectric transducer as both a transmitter and receiver of acoustic pulses, as this configuration typically reduces system complexity and cost. When operated as a transmitter, however, the transducer acts as resonator which is prone to self-oscillation ("reverberation") for some time after the end of each transmitted pulse. The amplitude of vibration during the transmission phase (and for much of the reverberation phase) is orders of magnitude greater than the typical amplitude of a received echo, which causes the receiver portion of the controller to be saturated and unable to detect any echo that might be received during this time. The system can only detect echoes having a two-way travel time greater than the time required for the reverberation amplitude to fall below an echo detection threshold.

The distance corresponding to this minimum two-way travel time is called "the blind zone". In principle, the blind zone represents a minimum detection range inside which the ultrasonic radar system is unable to detect anything. For example, a parking-assist system may employ such ultrasonic radar systems as parking-assist sensors ("PAS") to monitor the distance between the vehicle and nearby obstacles, but they would be unable to warn the driver of any obstacles so near as to be within their blind zones. Thus it is desirable to minimize the blind zone by minimize reverberation of the transducers. Yet it would be undesirable for such minimization to unduly increase system complexity or cost and thereby undercut the traditional advantages of this system configuration.

SUMMARY

Accordingly, there are disclosed herein various piezoelectric transducer controllers and control methods having adaptively tuned linear damping, at least some of which may be suitable for use in ultrasonic radar systems. An illustrative controller embodiment includes: a transmitter that causes reverberation of a piezoelectric transducer; and a linear damping module that measures characteristics of the reverberation and tunes one or both of a shunt resistance and a shunt reactance for the piezoelectric transducer based on said characteristics. An illustrative sensor embodiment includes: a piezoelectric transducer; and a transducer controller coupled to the piezoelectric transducer to transmit pulses and receive echoes for measuring distances. The controller includes a linear damping module with: a shunt resistance and a shunt inductance each coupled in parallel to the piezoelectric transducer to damp reverberation of the piezoelectric transducer after said transmit pulses. The controller measures at least one characteristic of said reverberation and responsively tunes the shunt resistance and/or the shunt inductance.

An illustrative embodiment of a distance measurement method includes: adjusting, in a linear damping module, at least one of a shunt resistance value and a shunt reactance value; driving a piezoelectric transducer to transmit ultrasonic pulses; enabling the linear damping module to damp reverberation after each transmitted ultrasonic pulse; measuring reverberation periods when the linear damping module is enabled; associating trends in the reverberation periods with adjustments to said values; and repeating adjustments associated with reverberation period reductions and reversing adjustments associated with reverberation period increases.

Each of the foregoing embodiments may have one or more of the following features in any combination: (1) the shunt reactance is a tunable shunt inductance having a value $L_P$. (2) the linear damping module measures a reverberation period and adaptively adjusts the shunt resistance and the shunt reactance to minimize the reverberation period. (3) the linear damping module measures a decay rate $\alpha$ to estimate a series inductance $L_S$ of the piezoelectric transducer. (4) the estimated series inductance $L_S$ is expressible as $$L_S = \frac{R_S}{2\alpha},$$

being a series resistance of the transducer. (5) the linear damping module estimates $R_S$ as a ratio of a peak driving voltage for the transducer to a peak short-circuit current of the transducer. (6) the shunt resistance is initially tuned to a value expressible as $R_D = \pi f_S \sqrt{L_S L_P}$, $f_S$ being a measured frequency of said reverberation. (7) the measured characteristics include a reverberation frequency $f_S$. (8) the linear damping module estimates a parallel capacitance $C_P$ of said transducer. (9) the shunt reactance is initially tuned to an inductance value expressible as $$L_P = \frac{1}{(2\pi f_S)^2 C_P}.$$

(10) the linear damping module estimates $C_P$ by temporarily scaling the shunt inductance up and measuring a reverberation frequency $f_P$. (11) the linear damping module estimates $C_P$ by supplying a current to the piezoelectric transducer and measuring a time to reach a reference voltage. (12) the linear damping module estimates $C_P$ by measuring a rate of change in a phase difference between a current in the shunt reactance and a piezoelectric transducer voltage. (13) the reactive component is a negative capacitance. (14) the at least one characteristic comprises a length of the reverberation, and the controller responsively tunes the shunt resistance and the shunt inductance to minimize said length. (15) the method further includes disabling the linear damping module after damping is finished and detecting echoes of transmitted ultrasonic pulses. (16) said adjusting is performed on only one of the shunt resistance and shunt reactance before a given enabling of the linear damping module. (17) the method further includes characterizing the piezoelectric transducer and performing a coarse tuning of the shunt resistance and shunt reactance before performing said driving, enabling, measuring, associating, and repeating operations.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

Figure 1:
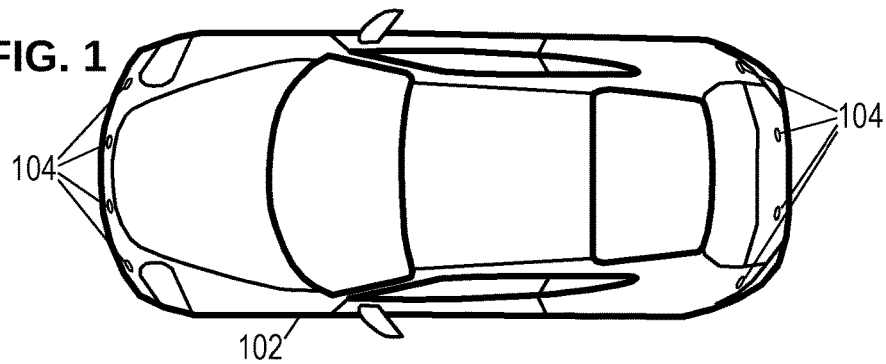
FIG. 1 is an overhead view of an illustrative vehicle equipped with parking-assist sensors.

FIG. 1 shows an illustrative vehicle 102 equipped with a set of ultrasonic parking-assist sensors 104. The number and configuration of sensors in the sensor arrangement varies, and it would not be unusual to have six sensors on each bumper with two additional sensors on each side to act as blind-spot detectors. The vehicle may employ the sensor arrangement for detecting and measuring distances to obstacles in the various detection zones as part of providing one or more services such as, e.g., collision warning, automated parking assistance, blind spot monitoring, etc.

The ultrasonic sensors are transceivers, meaning that each sensor can transmit and receive pulses of ultrasonic sound. Emitted pulses propagate outward from the vehicle until they encounter and reflect from an object or some other form of acoustic impedance mismatch. The reflected pulses return to the vehicle as "echoes" of the emitted pulses. The times between the emitted pulses and received echoes are indicative of the distances to the reflection points. Preferably only one sensor transmits at a time, though all of the sensors may be configured to measure the resulting echoes.

Figure 2:
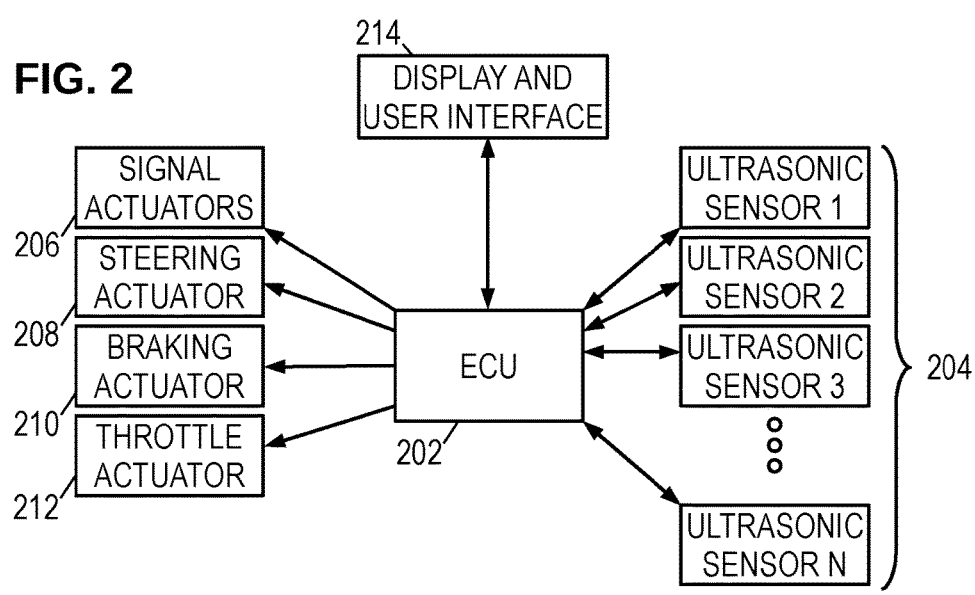
FIG. 2 is a block diagram of an illustrative parking assist system.

FIG. 2 shows an electronic control unit (ECU) 202 coupled to the various ultrasonic sensors 204 as the center of a star topology. (Use of the star topology is illustrative— other system architectures may be employed, including a bus architecture.) To provide services such as automated parking assistance, the ECU 202 may further connect to a set of actuators such as a turn-signal actuator 206, a steering actuator 208, a braking actuator 210, and throttle actuator 212. ECU 202 may be further coupled to a user-interactive interface 214 to accept user input and provide a display of the various measurements and system status. Using the interface, sensors, and actuators, ECU 202 may provide automated parking, assisted parking, lane-change assistance, obstacle and blind-spot detection, and other desirable features.

Figure 3:
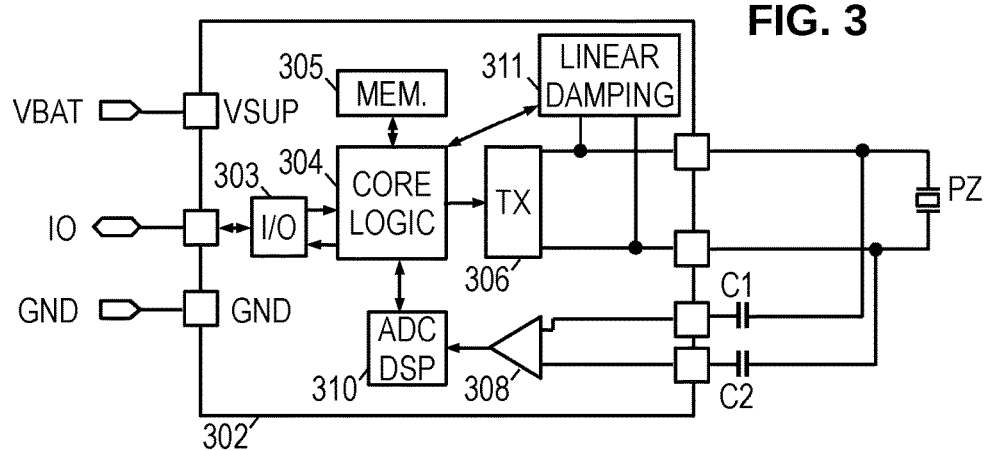
FIG. 3 is a circuit schematic of an illustrative ultrasonic sensor.

FIG. 3 shows an illustrative ultrasonic sensor having a piezoelectric transducer (PZ) coupled to a dedicated transducer controller 302. (A transformer-less design is shown here, but the principles of the present application are also applicable to systems having the transmit terminals of the controller coupled to the transducer PZ via a step-up voltage transformer.) While it is currently preferred to provide each transducer with a dedicated controller, it is also feasible to have multiple transducers coupled to a shared controller that employs the principles set forth herein. The transducer controller 302 may be an application-specific integrated circuit (ASIC), though field-programmable gate array (FPGA) and structured ASIC implementations are also contemplated. The transducer controller 302 includes two power terminals (VBAT and GND) and, in at least some contemplated embodiments, includes a single input/output ("I/O" or "IO") line for communicating with the ECU 202. A suitable communication protocol would be designed to have only one of the two controllers (ECU 202 or controller 302) controlling the I/O line at any given time.

Transducer controller 302 includes an I/O interface 303 that, when placed in a receive mode, monitors the I/O line for transmissions from the ECU 202 and, when placed in a transmit mode, drives the state of the I/O line to send data to the ECU. In some systems, the ECU 202 may periodically poll each sensor to trigger measurements and receive the resulting measurement data.

Transducer controller 302 includes a core logic 304 that operates in accordance with firmware and parameters stored in nonvolatile memory 305 to parse commands from the ECU 202 and carry out the appropriate operations, including the transmission and reception of ultrasonic pulses. To transmit an ultrasonic pulse, the core logic 304 uses a transmitter 306 which drives a pair of transmit terminals on the sensor controller 302. Piezoelectric transducer PZ is coupled to the transmit terminals and is further coupled, via coupling capacitors C1 and C2, to a pair of receive terminals. Coupling capacitors C1, C2 provide DC-isolation and facilitate the use of internal voltage clamps on the receive terminals, protecting the low noise amplifier (LNA) 308 against damage during the transmit and reverberation periods. One terminal of the piezo PZ can be in some embodiments connected to the ground terminal GND.

The received echo signals are typically in the millivolt or microvolt range, and accordingly, the controller 302 includes a low-noise amplifier 308 to amplify the signal from the receive terminals. The controller 302 may further include a digital signal processor (DSP) 310 with an integrated analog-to-digital converter (ADC) to digitize and process the amplified receive signal. The DSP 310 applies programmable methods to measure the actuation period of the transducer during the transmission of a pulse (including the ensuing reverberation or "ringing" period), and to detect and measure the lengths of any received pulses or "echoes". Such methods may employ threshold comparisons, minimum intervals, peak detections, zero-crossing detection and counting, noise level determinations, and other customizable techniques tailored for improving reliability and accuracy. The DSP 310 may further process the amplified receive signal to analyze characteristics of the transducer, such as resonance frequency and decay rate, and may further detect error conditions such as an excessively short actuation period (which may be due to a disconnected or defective transducer, suppressed vibration, or the like) or an excessively long actuation period (defective mounting, inadequate damping resistance, or the like).

In at least some embodiments, such as those suitable for systems having a LIN bus architecture, the core logic 304 employs the DSP 310 to measure echo travel times and/or the corresponding distance to the objects reflecting the ultrasonic pulses. The core logic communicates these measurements to the ECU 202, which combines measurements from multiple sensors to provide the desired services and/or information to the driver. In certain alternative embodiments, such as those suitable for systems having a star topology, the time measurement and corresponding distance evaluation is performed by the ECU. In such embodiments, the DSP is not measuring the time, it is detecting presence of an ultrasonic echo higher than threshold level and is indicating detection of the echo in real time by pulling the 10 line to a predefined level To minimize the blind zone, the controller 302 includes at least a linear damping module 311 that may operate under control of the transmitter 306, DSP 310, or core logic 304, to shorten the reverberation period. It may operate alone or as part of a multi-phase damping system that includes, e.g., active damping operations by the transmitter 306. Where active damping operations are employed, the transmitter 306 applies an out-of-phase signal at the end of the transmit pulse to oppose the residual vibrations, in accordance with techniques outlined elsewhere in the literature. Typically such active damping must be terminated once the reverberation amplitude falls below a threshold where there exists a significant probability of exciting additional reverberations. Thus, even where active damping is employed, the piezoelectric transducer may be left with residual vibration, which can be beneficially minimized using the linear damping module.

Figure 4A:
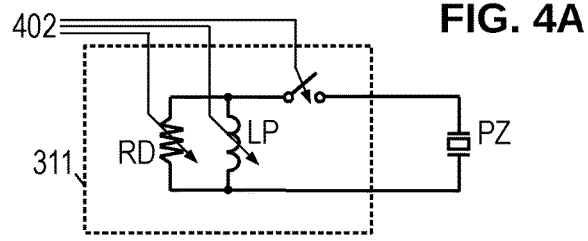
FIG. 4A is a simplified schematic for an illustrative linear damping feature.
Figure 4B:
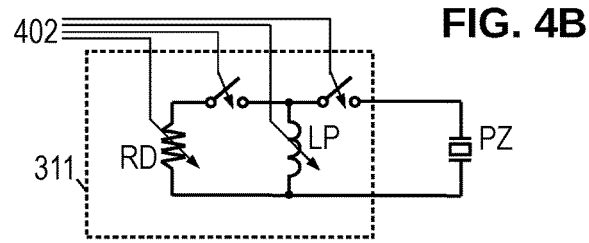
FIG. 4B is a linear damping module with additional configurability.
Figure 4C:
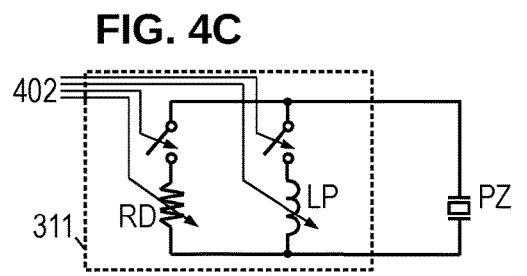
FIG. 4C is a linear damping module with alternative configurability.

FIG. 4A shows an illustrative linear damping module embodiment having a tunable shunt resistance ($R_D$), a tunable shunt reactance and a switch. The shunt reactance is shown as a tunable inductance ($L_P$), but in an alternative embodiment the shunt reactance may be a tunable, negative capacitance, which can be implemented using active circuit elements. A set of control signals 402 may be provided by the transmitter, DSP, and/or core logic. To prevent the linear damping module from attenuating the transmit pulse, the switch operates under control signals to implement linear damping only after transmit pulse finished, including and active damping phase. FIGS. 4B and 4C show linear module embodiments providing additional configuration flexibility, in that an additional switch is included, making it possible to disconnect resistor $R_D$ while leaving inductance $L_P$ connected, or disconnecting both.

The linear damping module 311 provides optimal damping (i.e., minimizes the length of the reverberation period) when the shunt resistance $R_D$ and inductance $L_P$ are properly tuned. However damping performance is very sensitive to the tuning of these elements, so that even small errors can lead to significant degradation of performance. Moreover, piezoelectric transducers typically have fairly significant temperature coefficients and may be subject to loading from water and debris on their surface; thus it is desirable to make such tuning adaptive and responsive while preserving accuracy. The control signals 402 provide such tuning to the shunt resistance $R_D$ and shunt inductance $L_P$.

Figure 4D:
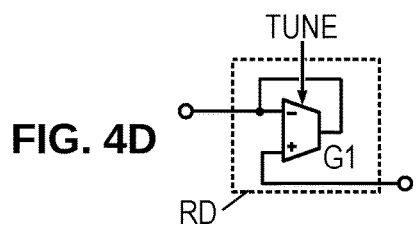
FIG. 4D is an illustrative variable resistor implementation.

FIG. 4D shows one illustrative embodiment of tunable shunt resistance $R_D$, having a transconductance amplifier G1 that sources or sinks a current from the left hand terminal, the current being proportional to the difference between the two terminals. The control signal TUNE sets the gain of amplifier G1 in inverse proportion to the desired resistance of $R_D$.

Figure 4E:
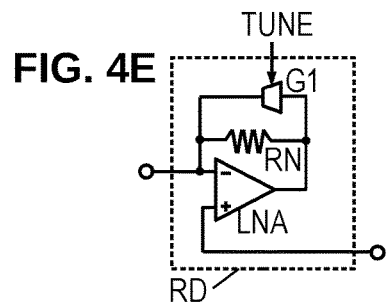
FIG. 4E is a second illustrative variable resistor implementation.

FIG. 4E shows another illustrative embodiment that provides greater precision, using a low noise op-amp (LNA) with the inverting input coupled to the left hand terminal of $R_D$, and the non-inverting input tied to the LNA output and coupled to the right hand terminal of $R_D$, which is typically coupled to ground. The LNA amplifies the voltage difference between the terminals, producing an output signal that remains proportional to the voltage difference between the terminals. This output signal is applied to a nominal resistance RN and to the input of the transconductance amplifier G1. The nominal resistance and transconductance amplifier each sink or source a current from the left hand terminal that is proportional to the output signal. The nominal feedback resistance RN, when accounting for the LNA gain, sets an initial resistance value. In parallel with the nominal feedback resistance RN, the transconductance amplifier G1 operates to modify the nominal resistance in a tunable fashion. As the control signal TUNE adjusts the gain of the transconductance amplifier, the effective resistance of shunt resistance $R_D$ is modified. In at least some embodiments, the TUNE signal is provided via a digital to analog converter.

Figure 4F:
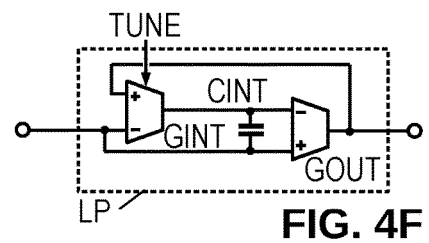
FIG. 4F is a schematic of an illustrative variable inductor implementation.

FIG. 4F shows one illustrative embodiment of tunable shunt inductance $L_P$. The leftside terminal of $L_P$ is coupled to an inverting input of a transdconductance amplifier Gint, one side of a capacitor Cint, and the non-inverting input of transconductance amplifier Gout. The output of transconductance amplifier Gint is coupled to the other side of capacitor Cint and the inverting side of Gout. The output of transconductance amplifier Gout is coupled to the rightside terminal of $L_P$ and to the noninverting input of Gint.

In operation, Gint sources a current proportional to the difference between the input and output terminals, thereby charging capacitor Cint accordingly. The capacitor voltage is the integral of this current, thus corresponding to the current that would be flowing through an equivalent inductor. Transconductance amplifier Gout converts this capacitor voltage into a corresponding current, thereby making $L_P$ behave as a synthetic inductor having an inductance value of $L_P$=Cint/(Cint*Gout). The gain of transconductance amplifier Gint is controlled by a control signal TUNE, enabling the inductance to be tuned. As before, the TUNE signal may be supplied via a digital-to-analog converter.

Figure 4G:
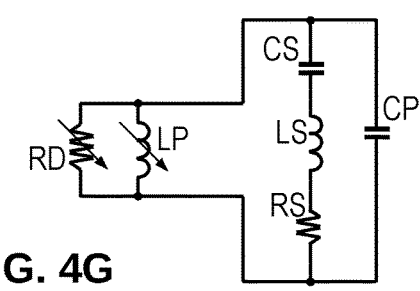
FIG. 4G is a schematic of an illustrative equivalent circuit.

To determine suitable values for optimal damping, we turn to FIG. 4G which replaces the piezoelectric transducer PZ with an equivalent circuit. The illustrated equivalent circuit shown is an approximation suitable for present purposes. Such equivalent circuits are typically available from the manufacturer, but can be derived if necessary by fitting the equivalent circuit's parameterized response the frequency-dependent impedance measured from the transducer. As previously mentioned, the equivalent circuit parameters are expected to have significant variation, so it is desirable to employ a fast estimation technique for periodically establishing suitable tuning values and an adaptation technique for refining and tracking optimized tuning values.

The equivalent circuit includes a capacitor ($C_P$) in parallel with a series combination of a capacitor ($C_S$), an inductor ($L_S$), and a resistor ($R_S$). The series combination between the transducer terminals provides a circuit impedance with a resonant frequency (referred to herein as the series resonant frequency):

$$f_S = \frac{1}{2\pi\sqrt{L_S C_S}} \tag{1}$$

It is expected that this will be the dominant resonance peak and that accordingly the acoustic pulses will be transmitted at $f_S$ for increased signal strength and improved efficiency and sensitivity. The controller 302 can measure $f_S$ by supplying a pulse or other wideband signal to the transducer PZ with the transmitter and measuring the period of the residual vibrations with the DSP. Alternatively, the controller may employ a frequency sweep to identify which frequency provides the strongest transmit signal. The controller may further begin operating with a default or initial estimate of the series resonant frequency and may employ a frequency adaptation technique to refine and track the optimum value.

The parallel combination of capacitor $C_P$ with shunt inductance $L_P$ and shunt resistance $R_D$ will define a second resonant frequency (referred to herein as the parallel resonant frequency):

$$f_P = \frac{1}{2\pi\sqrt{L_P C_P}} \tag{2}$$

It can be shown that optimal damping of the transducer vibrations (represented by the currents in the equivalent circuit) is achieved when the parallel resonant frequency is matched to the series resonant frequency (i.e., when $f_P = f_S$), and when the shunt resistance $R_D$ is tuned to half the geometric mean of the inductor impedances for both circuits:

$$R_D = \left(\frac{1}{2}\right) 2\pi f_S \sqrt{L_S L_P} \tag{3}$$

(The factor of one-half accrues because there are two resonant circuits in parallel.) These requirements translate into the following equations for the optimally tuned values of $L_P$ and $R_D$:

$$L_P = \frac{L_S C_S}{C_P} = \frac{1}{(2\pi f_S)^2 C_P} \tag{4}$$

$$R_D = \frac{1}{2}\sqrt{\frac{L_S}{C_P}} \tag{5}$$

In at least some embodiments, the process for tuning the linear damping module proceeds in two phases. In the first phase, measurements of $C_P$ and $L_S$ are obtained and used to provide a coarse tuning of the shunt inductance and shunt resistance. In the second phase, an adaptive optimization process may be applied to refine the shunt inductance and shunt resistance to their optimum values and to track those optimum values as the transducer characteristics change due to temperature variation or loading.

With respect to the first phase, the series resonance frequency $f_S$ is measured if it is not already known. Options for this measurement have been discussed previously, and include a frequency sweep or a wideband pulse followed by measuring the residual vibration frequency.

Next, the capacitor $C_P$ is measured. In a first approach to this measurement the tunable inductance $L_P$ is scaled upward significantly. In the design phase for linear damping module 311 (FIG. 4A), a nominal value of $L_P$ will have been chosen in accordance with typical values of $C_P$ and $f_S$ ($C_S$ and $L_S$ can optionally be used instead of $f_S$) provided by the manufacturer, in accordance with Equation (4). A suitable scaled value would be four times greater, or enough to place the parallel resonant frequency (per Equation (2)) at about half the typical $f_S$ value. Other scale factors may be chosen with the goal of lowering the parallel resonant frequency $F_P$ and separating it from the series resonant frequency $f_S$. (Lowering is desirable because the transducer typically has higher secondary resonant frequencies.) The transducer is then pulsed or subjected to a frequency sweep to identify the new value of parallel resonant frequency $f_P$. This measurement can then be used with the scaled $L_P$ value to determine the value of $C_P$ in accordance with Equation (2).

Figure 5:
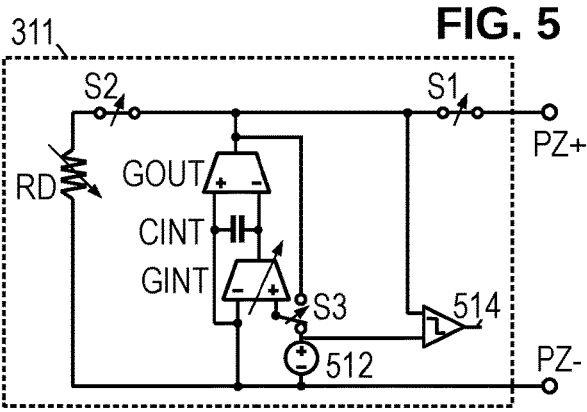
FIGS. 5-7 are linear damping circuits for various illustrative coarse tuning implementations.

In a second approach to the measurement of $C_P$, the linear damping module 311 measures the time required for a current source to quickly charge $C_P$ to a given voltage. FIG. 5 shows an illustrative implementation of module 311 that exploits the structure of tunable inductance $L_P$ to achieve this measurement. The damping module 311 is coupled to a quiescent transducer PZ via closed switch S1, with tunable resistance $R_D$ decoupled by opening of switch S2. Switch S3 is used to open the connection from the upper terminal of $L_P$ to the non-inverting input of Gint, instead coupling a reference voltage 512 between the inverting and non-inverting inputs of the transconductance amplifier. The amplifier Gint provides a corresponding reference current to capacitor Cint, causing it to charge at a constant rate. The output transconductance amplifier Gout converts the resulting voltage ramp into a current ramp, causing $C_P$ to charge at a quadratic rate. A comparator 514 indicates when the $C_P$ voltage exceeds the reference voltage. The time required for the reference voltage to be reached is $$t = \sqrt{2L_P C_P} \tag{6}$$

To match the parallel and series resonant frequencies, the ideal charging time is:

$$t_{ideal} = \frac{\sqrt{2}}{2\pi f_S} \tag{7}$$

The shunt inductance $L_P$ can be calculated and set accordingly. (Note however that with a charging rate near the ideal, excitation of the series resonant circuit may occur and introduce an error in the measurement. The charging rate may be reduced to avoid this secondary effect, at the cost of increasing error due to the charge collected on the series capacitor $C_S$.) The desired shunt inductance value can be expressed relative to the previous shunt inductance value as:

$$L_{P,new} = L_{P,old} \frac{t_{ideal}^2}{t_{measured}^2} \tag{8}$$

Such a ratiometric calculation may be more amenable for analog implementation. If desired, the measurement may be iteratively repeated with the new inductance values until the ratio of ideal and measured time approaches one.

Figure 6:
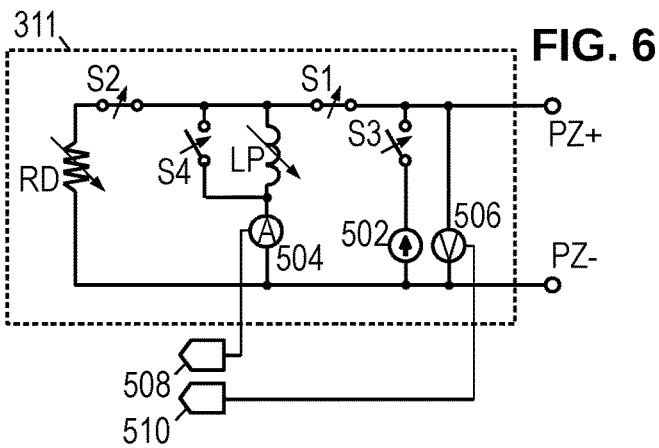

In a third approach to the measurement of $C_P$, the linear damping module 311 measures the phase shift between the shunt inductor current and the voltage on the piezoelectric transducer. FIG. 6 shows an illustrative implementation of linear damping module 311 that may be used to implement this approach (or variants of the previous approaches). A current source 502 excites the piezoelectric transducer PZ. For the present approach, the current source provides an oscillatory signal at the series resonant frequency $f_S$. An ammeter 504 measures the current through inductor $L_P$, while a voltmeter 506 measures the current across the piezoelectric transducer PZ. Analog-to-digital converters 508, 510 supply the current and voltage measurements to, e.g., the DSP, which monitors the phase relationship between the two. The phase shift can be measured using differential digital signal processing measurements such as correlation or zero crossing detection. If the phase shift between them is steady at about 90°, the inductor $L_P$ is well tuned for effective damping. Conversely, if the phase shift is increasing or decreasing, the inductor $L_P$ should be adjusted based on the rate of change.

Figure 7:
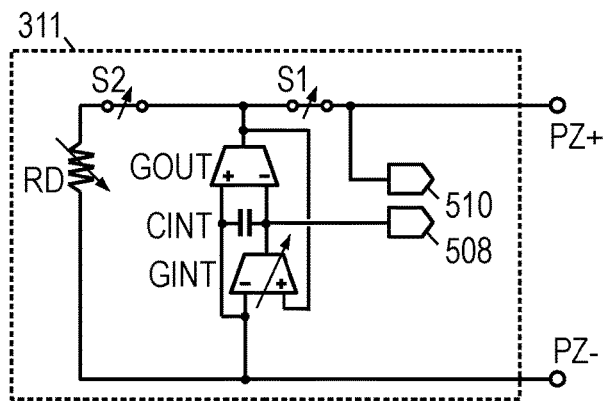

FIG. 7 shows another illustrative implementation that exploits the structure of the tunable inductor $L_P$. The current through the inductor $L_P$ corresponds to the voltage on capacitor Cint. Analog to digital converters 508, 510, thus serve to provide digitized measurements of the current and voltage equivalent to the measurements obtained in the implementation of FIG. 6.

Once the tunable inductor $L_P$ has been set to a suitable value, the coarse tuning process continues with a determination of a suitable value for $R_D$. To determine a value for coarse tuning of $R_D$, the linear damping module 311 implementation of FIG. 6 may be used with a shorting switch S4 to bypass the shunt inductor $L_P$. Initially, the linear damping module 311 is disabled by opening switch S1. A strong, low impedance output buffer is used to drive the piezoelectric transducer at the series resonant frequency $f_S$. (The controller 302 may employ transmitter 306 for this purpose.) When transducer is driven in this fashion, the current flowing in series branch of the transducer is equal to the driving voltage divided by the resistance of resistor $R_S$. The linear damping module 311 measures the peak driving voltage, optionally storing it using sample and hold circuit. Thereafter, the piezoelectric transducer terminals are shorted together to obtain a current measurement. If the linear damping module of FIG. 6 is equipped with a shorting switch S4 to bypass the inductor while still permitting a current measurement, switch S1 is closed, S2 is open, S3 is open, and the shorting switch S4 is closed.

For short period of time after the transducer terminals are shorted, the current measured by the ammeter 504 is approximately equal to the current generated by the series resonator. This current is sampled shortly (e.g., one oscillation period) after the terminals are shorted and the peak value is measured. The ratio of this peak voltage and peak current is approximately equal to the resistance of RS.

Next the controller 302 opens the shorting switch and measures the decay rate α of the residual vibrations. The amplitude of the series resonance vibrations can be expressed:

$$a(t) = a_0 \exp(-\alpha t) \exp(j2\pi f_S t) \quad (9)$$

where α is the decay rate. To minimize the effect of capacitor $C_P$, the residual vibrations may be measured using an Analog-to-digital converter with low input impedance. The DSP may employ an IQ demodulator to calculate the amplitude envelope (absolute value) of the residual vibrations. The decay rate can then be measured by calculating the ratio of the envelope to a delayed version of itself. The decay rate α is the (negative) logarithm of this ratio divided by the delay.

With the foregoing measurements of series resonant frequency, series resistance RS, and decay rate α, the controller 302 can determine the series inductor $L_S$ and the optimal shunt resistance $R_D$. We note here that Q can be expressed as:

$$Q = \frac{2\pi f_S}{2\alpha} \quad (10)$$

Q is also expressible as $$Q = \frac{2\pi f_S L_S}{R_S} \quad (11)$$

Equations (10) and (11) can be combined to yield:

$$L_S = \frac{R_S}{2\alpha} \quad (12)$$

The optimal value for $R_D$ is then calculable in accordance with Equation (3). The controller 302 sets the shunt resistance to this value and concludes the coarse tuning phase of the linear damping.

Setting aside some of the approximations made in the foregoing derivation of optimal tuning values for $L_P$ and $R_D$, it is expected that the equivalent circuit itself is an approximation and moreover that there may be second order effects. While a good damping performance is expected to be achieved from the use of these coarse tuning values, the use of a second, fine-tuning phase is expected to be beneficial.

Figure 8:
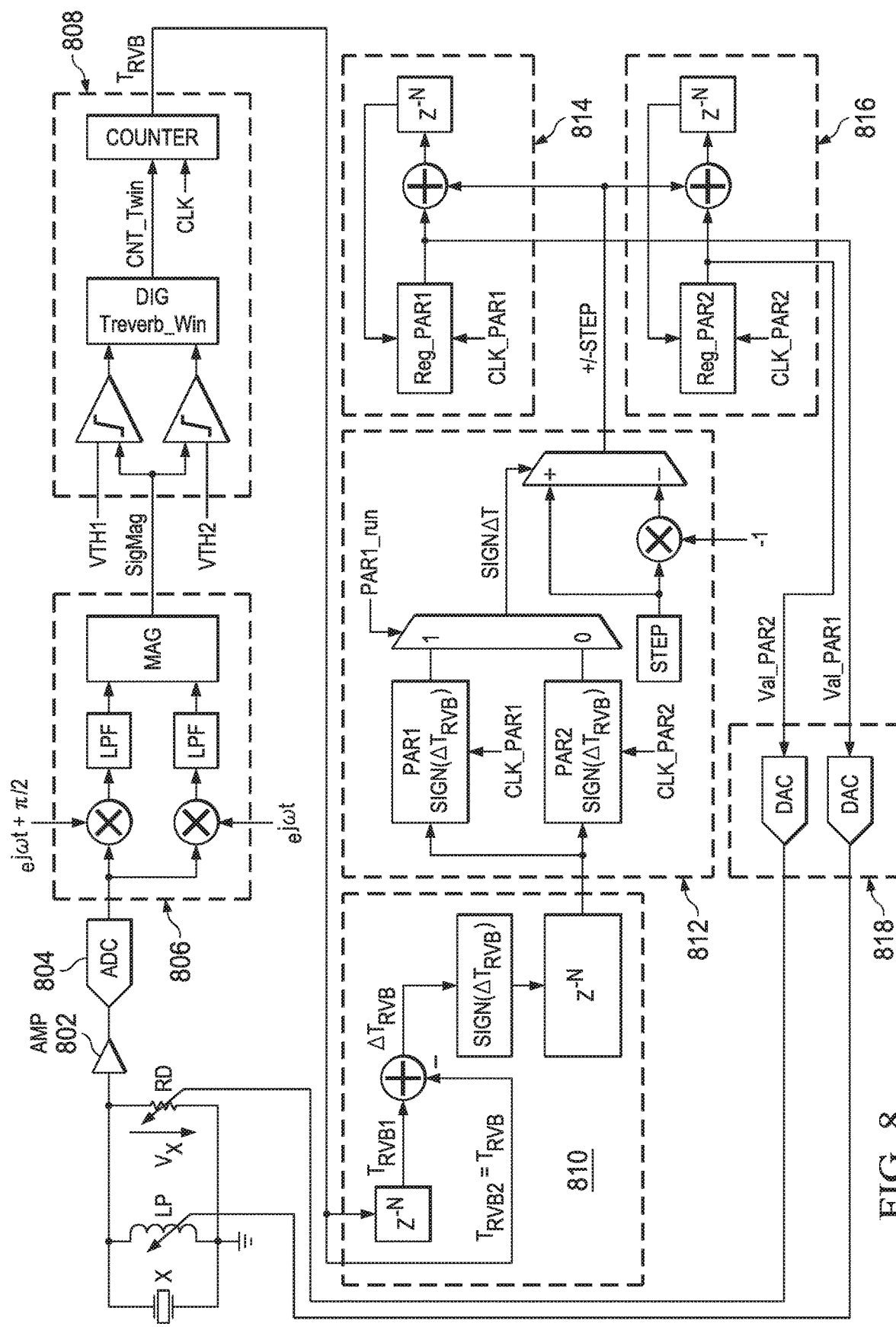
FIG. 8 is a linear damping circuit with an illustrative fine tuning implementation.

FIG. 8 shows one illustrative implementation of a fine-tuning unit that may be incorporated in the DSP or the core logic of controller 302. As shown, the piezoelectric transducer voltage is buffered by an amplifier 802 and digitized by an analog to digital converter 804. An envelope calculator 806 performs IQ demodulation and combines the orthogonal streams to determine the absolute magnitude of the signal. A reverberation timer 808 applies the absolute magnitude to two comparators, the outputs of which are combined to enable a counter to time how long the envelope takes to traverse from the upper threshold to the lower threshold. This count is output as a representative length of the reverberation period.

A trend filter 810 compares the reverberation period signal with a delayed version of itself to determine if the reverberation period has increased or decreased in response to a previous adaptation of the $L_P$ or $R_D$ values. An allocator unit 812 accepts a trend signal from the trend filter and stores it in a first latch if the trend is in response to a previous adaptation of the $L_P$ value, or stores it in a second latch if the trend is in response to a previous adaptation of the $R_D$ value. For subsequent adjustments of those parameters, the allocator uses a multiplexer to select between the latches, applying the appropriate trend sign to a second multiplexer to choose between a positive or negative change to the corresponding parameter, as appropriate to minimize the reverberation period. When the change is for the $L_P$ value, it is applied to the current $L_P$ value by a first updater unit 814. Conversely, when the change is for the $R_D$ value, it is applied to the current $R_D$ value by a second updater unit 816. A pair of digital to analog converters applies the current values as tuning signals to the shunt inductor $L_P$ and shunt resistor $R_D$. The parameters are each adjusted in turn, with a subsequent reverberation period measurement being performed before any other adaptations are made. While alternating adjustments are contemplated, the adaptations may be interleaved with any integer ratio, e.g., adjusting $R_D$ three times as often as $L_P$.

Other optimization techniques are known and may be applied for adaptively fine-tuning the $L_P$ and $R_D$ values, including Proportional-Integrative-Derivative (PID) control and joint adaptation techniques. The disclosed coarse- and fine-tuning principles enable the linear damping module to be precisely tuned, thereby enabling fast damping of reverberations and a reduced minimum measurement distance to permit detection of closer obstacles, a key parameter for ultrasonic park assist sensors. Piezo transducer parameters are strongly temperature dependent, and subject to changes from aging or loading effects like dirt on the membrane. With active tuning, these effects are automatically tracked.

Figure 9:
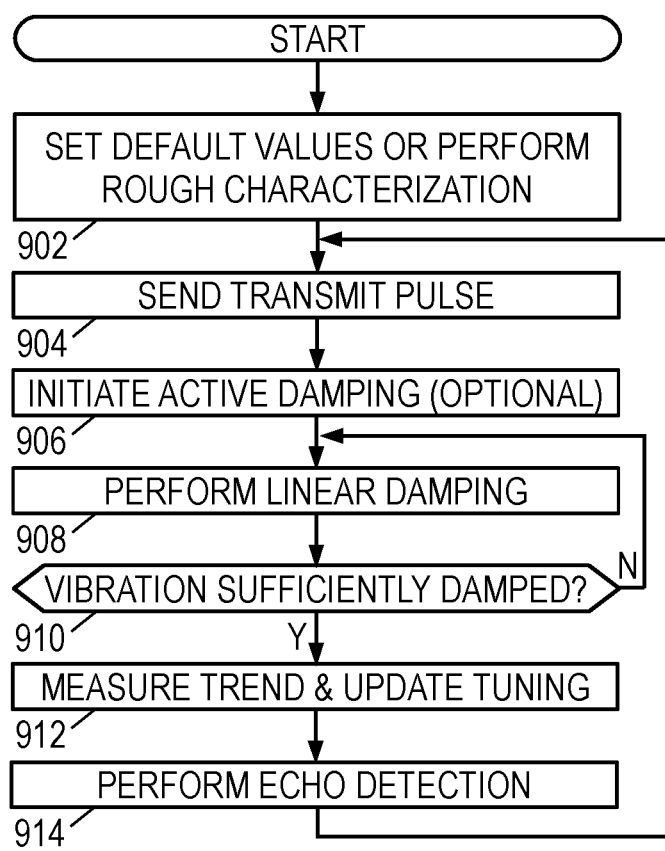
FIG. 9 is a flow diagram for an illustrative transducer control method.

FIG. 9 shows an illustrative transducer control method which begins in block 902 with performing a coarse tuning of the linear damping module in accordance with the foregoing discussion, or alternatively with applying default values for $L_P$ and $R_D$. In block 904, the transducer controller 302 sends a transmit pulse. Upon termination of the pulse, the transducer controller 302 optionally initiates active damping by driving the transducer in opposition to its reverberation. Such active damping may be performed until the residual vibrations have fallen below a predetermined threshold. In block 908, the controller performs linear damping of the residual vibrations. In block 910, the controller checks to verify damping is complete, i.e., below a threshold for detecting echoes. If not, blocks 908 and 910 are repeated. While blocks 908 & 910 are performed, a timer is used to measure the length of the damped reverberation. In block 912, the reverberation length is compared to one or more preceding reverberation lengths to determine a trend. The trend is then used to update at least one of the $L_P$ and $R_D$ parameters. Meanwhile, echo detection is performed in block 914. Blocks 904-914 are repeated as necessary to monitor distances from the sensors to obstacles.

Any of the controllers described herein, or portions thereof, may be formed as a semiconductor device on a single semiconductor die. Though the operations shown and described in FIG. 9 are treated as being sequential for explanatory purposes, in practice the method may be carried out by multiple integrated circuit components operating concurrently and perhaps even with speculative completion. The sequential discussion is not meant to be limiting. Moreover, the foregoing embodiments may omit complicating factors such as parasitic impedances, current-limiting resistors, level-shifters, line clamps, etc., which may be present but do not meaningfully impact the operation of the disclosed circuits. Still further, the focus of the foregoing discussions has been ultrasonic sensors, but the principles are applicable to any transducers exhibiting residual vibration.

These and numerous other modifications, equivalents, and alternatives, will become apparent to those skilled in the art once the above disclosure is fully appreciated. The foregoing linear damping modules may be replaced by, or used in conjunction with, an alternative shunt circuit employing $R_D$ in combination with a negative shunt capacitance. It is intended that the following claims be interpreted to embrace all such modifications, equivalents, and alternatives where applicable.

It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. Inventive aspects may lie in less than all features of a single foregoing disclosed embodiment. Furthermore, while some embodiments described herein include some but not other features included in other embodiments, combinations of features of different embodiments are meant to be within the scope of the invention, and form different embodiments, as would be understood by those skilled in the art.

What is claimed is:
1. A distance measurement method that comprises:
adjusting, in a linear damping module, at least one of: a shunt resistance value and a shunt reactance value;
driving a piezoelectric transducer to transmit ultrasonic pulses;
enabling the linear damping module to damp reverberation after each transmitted ultrasonic pulse;
measuring reverberation periods when the linear damping module is enabled;
associating trends in the reverberation periods with adjustments to said values;
repeating adjustments associated with reverberation period reductions and reversing adjustments associated with reverberation period increases.

2. The method of claim 1, further comprising disabling the linear damping module after damping is finished and detecting echoes of transmitted ultrasonic pulses.

3. The method of claim 1, wherein said adjusting is performed on only one of the shunt resistance and shunt reactance before a given enabling of the linear damping module.

4. The method of claim 1, further comprising characterizing the piezoelectric transducer and performing a coarse tuning of the shunt resistance and shunt reactance before performing said driving, enabling, measuring, associating, and repeating operations.

5. The method of claim 4, wherein the characterizing includes measuring a parallel capacitance $C_P$ of the piezoelectric transducer.

6. The method of claim 5, wherein said measuring the parallel capacitance of the piezoelectric transducer includes measuring a time required for a current source to charge the transducer to a reference voltage.

7. The method of claim 5, wherein said measuring the parallel capacitance of the piezoelectric transducer includes temporarily scaling the shunt inductance up and measuring a reverberation frequency $f_P$.

8. The method of claim 5, wherein said measuring the parallel capacitance of the piezoelectric transducer includes measuring a rate of change in a phase difference between a current in the shunt reactance and a piezoelectric transducer voltage.

9. The method of claim 5, wherein said characterizing further includes measuring a series resonant frequency $f_S$, and wherein said coarse tuning includes setting the shunt reactance to an inductance value expressible as $$L_P = \frac{1}{(2\pi f_S)^2 C_P}.$$

10. The method of claim 4, wherein said characterizing includes measuring a decay rate $\alpha$ to estimate a series inductance $L_S$ of the piezoelectric transducer, and said coarse tuning includes setting the shunt resistance value based at least partly on the estimated series inductance $L_S$.

11. The method of claim 10, wherein the estimated series inductance $L_S$ is expressible as $$L_S = \frac{R_S}{2\alpha},$$

$R_S$ being a series resistance of the transducer estimated as a ratio of a peak driving voltage for the transducer to a peak short-circuit current of the transducer.

12. The method of claim 10, wherein the shunt reactance is a tunable inductance having a value $L_P$, and said coarse tuning includes setting the shunt resistance to a value expressible as $R_D = \pi f_S \sqrt{L_S L_P}$, $f_S$ being a measured frequency of said reverberation.

13. A piezoelectric transducer controller that comprises:
a transmitter that drives a piezoelectric transducer to transmit ultrasonic pulses;
a linear damping module having a shunt resistance and a shunt reactance to damp reverberation after each transmitted ultrasonic pulse;
a reverberation timer that measures reverberation periods when the linear damping module is enabled;
at least one updater unit that adjusts a value of at least one of: the shunt resistance and the shunt reactance; and
an allocator unit that associates trends in the reverberation periods with adjustments to said value, the at least one updater unit repeating adjustments associated with reverberation period reductions and reversing adjustments associated with reverberation period increases.

14. The controller of claim 13, further comprising core logic that disables the linear damping module after damping is finished and detects echoes of transmitted ultrasonic pulses.

15. The controller of claim 13, wherein said at least one updater unit adjusts only one of the shunt resistance and shunt reactance before a given use of the linear damping module to damp reverberation.

16. The controller of claim 13, further comprising core logic that characterizes the piezoelectric transducer and performs a coarse tuning of the shunt resistance and shunt reactance before coordinating said driving, enabling, measuring, associating, and repeating operations.

17. An ultrasonic sensor that comprises:
a piezoelectric transducer;
a transducer controller coupled to the piezoelectric transducer to perform a distance measurement method that includes:
adjusting, in a linear damping module, at least one of: a shunt resistance value and a shunt reactance value;
driving the piezoelectric transducer to transmit ultrasonic pulses;
enabling the linear damping module to damp reverberation after each transmitted ultrasonic pulse;
measuring reverberation periods when the linear damping module is enabled;
associating trends in the reverberation periods with adjustments to said values;
repeating adjustments associated with reverberation period reductions and reversing adjustments associated with reverberation period increases.

18. The sensor of claim 17, wherein the method further includes: disabling the linear damping module after damping is finished and detecting echoes of transmitted ultrasonic pulses.

19. The sensor of claim 17, wherein said adjusting is performed on only one of the shunt resistance and shunt reactance before a given enabling of the linear damping module.

20. The sensor of claim 17, wherein the method further comprises characterizing the piezoelectric transducer and performing a coarse tuning of the shunt resistance and shunt reactance before performing said driving, enabling, measuring, associating, and repeating operations.

* * * * *